(12) United States Patent
Kang

(10) Patent No.: US 6,897,080 B2
(45) Date of Patent: May 24, 2005

(54) METHOD FOR MANUFACTURING DIFFRACTION GRATING OF LASER DIODE

(75) Inventor: Jung-Koo Kang, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 241 days.

(21) Appl. No.: 10/339,431

(22) Filed: Jan. 9, 2003

(65) Prior Publication Data

US 2003/0147447 A1 Aug. 7, 2003

(30) Foreign Application Priority Data

Feb. 1, 2002 (KR) .......................................... 2002-5872

(51) Int. Cl.⁷ .............................................. H01L 21/20
(52) U.S. Cl. .......................................... 438/29; 438/32
(58) Field of Search ...................... 438/22–47, 745–757; 372/96, 102; 385/10, 37, 131; 430/321

(56) References Cited

U.S. PATENT DOCUMENTS

| 5,960,023 | A | * | 9/1999 | Takahashi | .................... 372/96 |
| 6,228,671 | B1 | * | 5/2001 | Inomoto | ....................... 438/32 |
| 6,455,338 | B1 | * | 9/2002 | Takagi et al. | .................. 438/24 |
| 6,750,478 | B2 | * | 6/2004 | Yoshida et al. | ................ 257/98 |
| 2003/0008428 | A1 | * | 1/2003 | Tsukiji et al. | .................. 438/29 |
| 2003/0064537 | A1 | * | 4/2003 | Yoshida et al. | ............... 438/32 |
| 2003/0147617 | A1 | * | 8/2003 | Park et al. | ................... 385/131 |

* cited by examiner

*Primary Examiner*—Savitri Mulpuri
(74) *Attorney, Agent, or Firm*—Cha & Reiter, L.L.C.

(57) ABSTRACT

Disclosed is a method for manufacturing a laser diode used as a light source in an optical communication system. The method comprises the steps of: forming a first photoresist pattern arranged at an interval corresponding to a predetermined grating cycle on the entire front surface of a semiconductor layer where a diffraction grating is to be formed; forming a diffraction-grating layer by etching the underlying semiconductor layer using the first photoresist pattern as an etching mask; forming a mask pattern on the diffraction-grating layer except for a predetermined diffraction-grating area; removing the mask pattern formed on top of parts of the diffraction-grating layer to be removed; and, removing the mask pattern resulting in the removal of the exposed parts of the diffraction-grating layer.

7 Claims, 10 Drawing Sheets

METHOD FOR MANUFACTURING DIFFRACTION GRATING OF LASER DIODE

CLAIM OF PRIORITY

This application claims priority to an application entitled "Method for Manufacturing Diffraction Grating of Laser Diode," filed in the Korean Industrial Property Office on Feb. 2, 2002 and assigned Serial No. 2002-5872, the contents of which are hereby incorporated by reference.

BACKGROUND OF THE INVENTION

1. Field of the Invention

The present invention generally relates to a method for manufacturing a laser diode used as a light source in an optical communication system. The invention relates more particularly to a method for manufacturing a diffraction grating, which is an essential process in manufacturing a Distributed Feed-Back Laser Diode (hereinafter, referred to as "DFB-Laser Diode") or an EML (Electroabsorption Modulated Laser).

2. Description of the Related Art

In general, a laser is an optical element providing strongly-oriented monochromatic light. A semiconductor laser is widely used in optical communication or optical-information processing, etc. The semiconductor laser is preferred because it is smaller than a ruby laser or a gas laser; it uses less power; its laser output can be modulated easily; and, it has a higher output than a He-Ne laser.

The manufacture of a diffraction grating, which provides an excellent optical mode from photon coupling, also has a great influence on the characteristics of a DFB-Laser Diode. In order to obtain an excellent single-mode (low order) spectrum, it is important to obtain a minute and correct grating cycle (A) of the diffraction grating.

A conventional manufacturing technique for the diffraction grating of a DFB-Laser Diode now will be described with reference to FIGS. 1a and 1b.

First, an InGaAs absorption layer and an InP cap layer are deposited on an InP substrate, then a SiN (or SiO$_2$) film is vapor deposited thereon, and typical photo-etching and wet-etching processes are performed, so that the SiN film pattern 5 is left only at portions where no diffraction grating is to be formed, as shown in FIG. 1a.

Thereafter, a photoresist for the purpose of manufacturing a diffraction grating is applied on top of the entire structure. Next, light exposure and development processes are performed to form a mask pattern arranged at an interval corresponding to a predetermined grating cycle of the diffraction grating (not shown).

Subsequently, the underlying InP cap layer and InGaAs absorption layer are etched using the photoresist as an etching mask as shown in FIG. 1b. The photoresist pattern and some parts 55 of the SiN film are then removed. This way, no part is etched where the SiN film is present. Only the parts absent of the film are etched, thereby enabling selective manufacturing of a diffraction grating.

However, the conventional method described above has a disadvantage in that when a photoresist for use in manufacturing a diffraction grating is applied on the SiN-film pattern formed in the area where no diffraction grating is to be formed, a "photoresist peeling-off phenomenon" occurs. That is, the photoresist 4 is peeled off at the "A" area in FIG. 1b due to the weakened adhesion of the photoresist. Moreover, there is another problem in that a diffusion phenomenon produced during a subsequent wet-etching process for forming a diffraction grating increases the etching rate in the boundary portions ("B" in FIG. 1b) of the SiN film, thus deteriorating the etching uniformity.

SUMMARY OF THE INVENTION

The present invention is to provide a method for manufacturing the diffraction grating of a laser diode while preventing the conventional "photoresist peeling-off phenomenon" during selective formation of the diffraction grating.

One aspect of the present invention is to provide a method for manufacturing the diffraction grating of a laser diode wherein selective formation of the diffraction grating is capable with improved etching uniformity.

According to one embodiment of the present invention, a method for manufacturing the diffraction grating of a laser diode is provided, the diffraction grating being selectively formed on predetermined parts of a semiconductor substrate, the method including the steps of:

forming a first photoresist pattern on an entire upper surface of a semiconductor layer where a diffraction grating is to be formed, arranged at an interval corresponding to a predetermined grating cycle;

forming a diffraction-grating layer by etching the semiconductor layer under the first photoresist pattern while utilizing the first photoresist pattern as an etching mask;

forming a mask pattern on the diffraction-grating layer except for a redetermined diffraction-grating area;

removing the mask pattern formed on parts of the diffraction-grating layer; and, removing the parts of the diffraction-grating layer left exposed upon removal of the mask pattern.

In the embodiment, the step of removing parts of the underlying diffraction-grating layer is achieved by:

forming a second photoresist pattern on the InP cap layer except for where parts of the InP cap layer are exposed after removing the mask pattern; and, etching and selectively removing the InGaAs absorption layer beneath the InP cap layer so that the InP cap layer over the InGaAs absorption layer is peeled off and removed.

In another embodiment, the method further includes the step of heat treating for at least two minutes at a temperature of at least 120 Celcius, after the step of forming the second photoresist pattern.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE PREFERRED EMBODIMENT

Figure 1A:
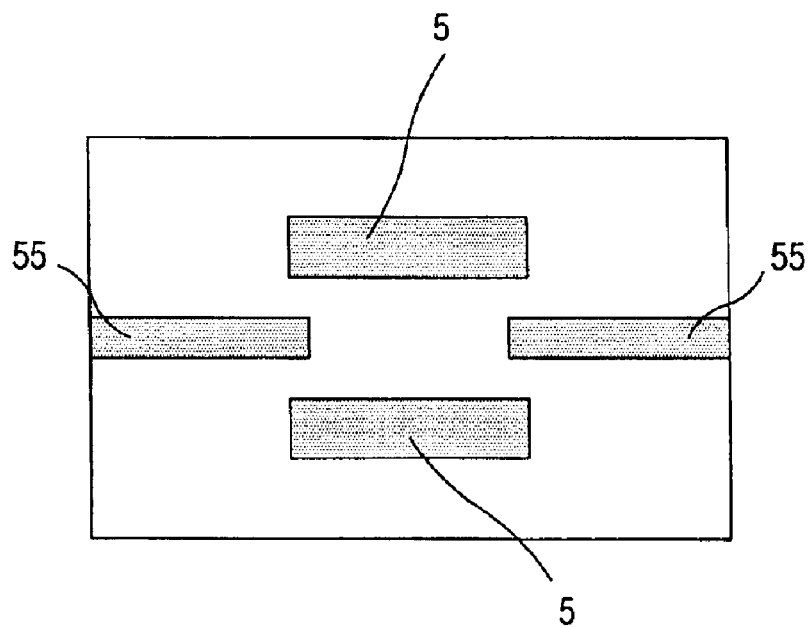
FIGS. 1a and 1b are plan views showing a conventional manufacturing technique for the diffraction grating of a DFB-Laser Diode.
Figure 1B:
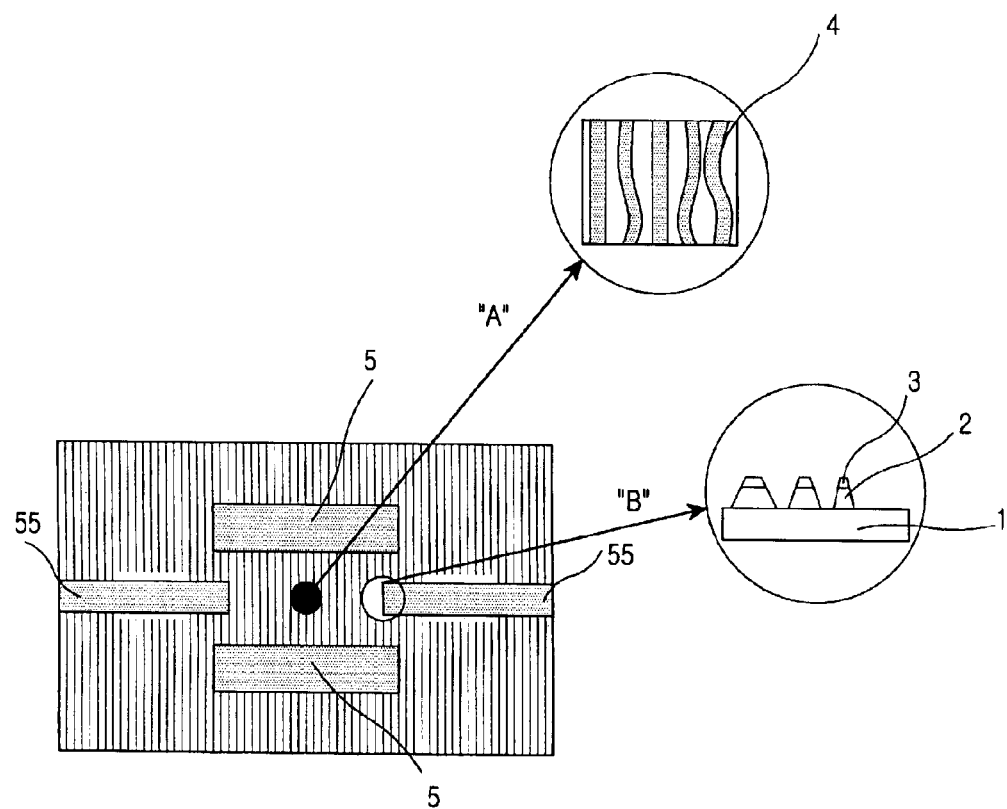

In accordance with the present invention, preferred embodiments according to the present invention will be described with reference to FIGS. 2a to 2c, 3, and 4a to 4d in the accompanying drawings. It should be noted that the same components are designated with the same reference numerals throughout the drawings. For the purposes of clarity and simplicity, a detailed description of known functions and configurations incorporated herein will be omitted as it may make the subject matter of the present invention unclear.

Figure 2A:
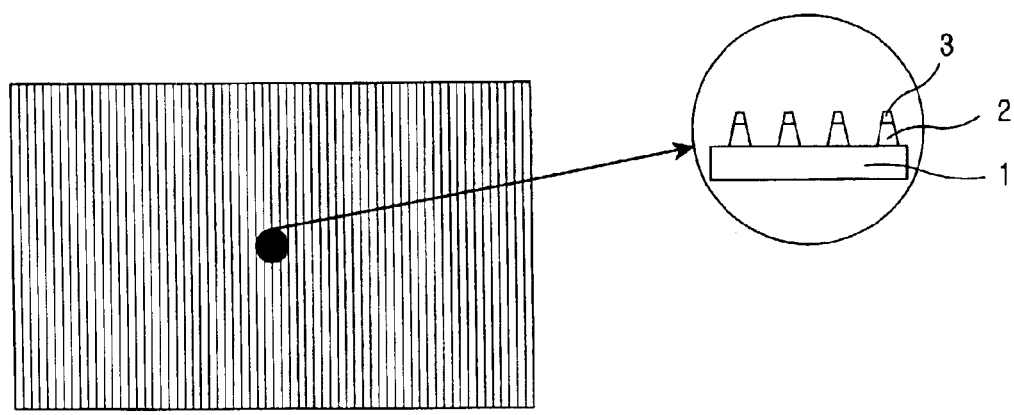
FIGS. 2a to 2c are plan views showing the steps of manufacturing a diffraction grating according to an embodiment of the present invention.

As shown in FIG. 2a, on an entire surface of an InP substrate 1 deposited with an InGaAs absorption layer 2 and an InP cap layer 3, a photoresist pattern is formed at an interval corresponding to a predetermined grating cycle. Then the underlying InP cap layer and then the InGaAs absorption layer are etched using the photoresist as an etching mask, so that a uniform diffraction grating is formed on the entire surface of the substrate.

Figure 2B:
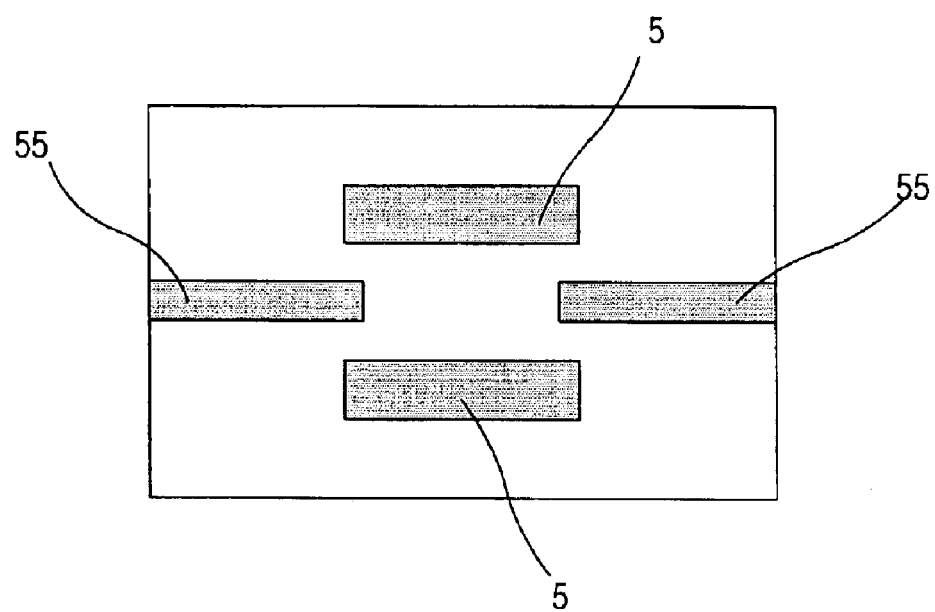

Subsequently, as shown in FIG. 2b, a $SiO_2$ (or SiN) film 5 is deposited on the entire structure. Typical photo-etching (lithography) and etching processes are thereafter performed, so that the $SiO_2$ film patterns 5 and 55 that serve as a mask are formed on the InP cap layer except for a predetermined diffraction-grating area.

Thereafter, the photoresist used during the photo-etching is removed, and another photoresist is formed through another photo-etching process. The subsequent photoresist is used to remove parts of the $SiO_2$ film pattern 55 where the InP cap layer and the InGaAs absorption layer are to be removed. At this point, heat treatment is performed for at least two minutes at an elevated temperature of at least 120° C., to prevent any damage to the photoresist used as a mask in the etching process.

Figure 2C:
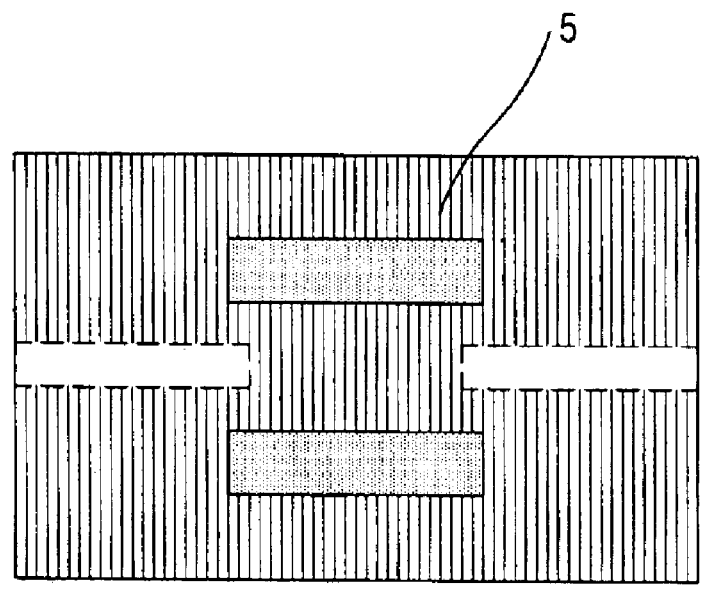
Figure 3:
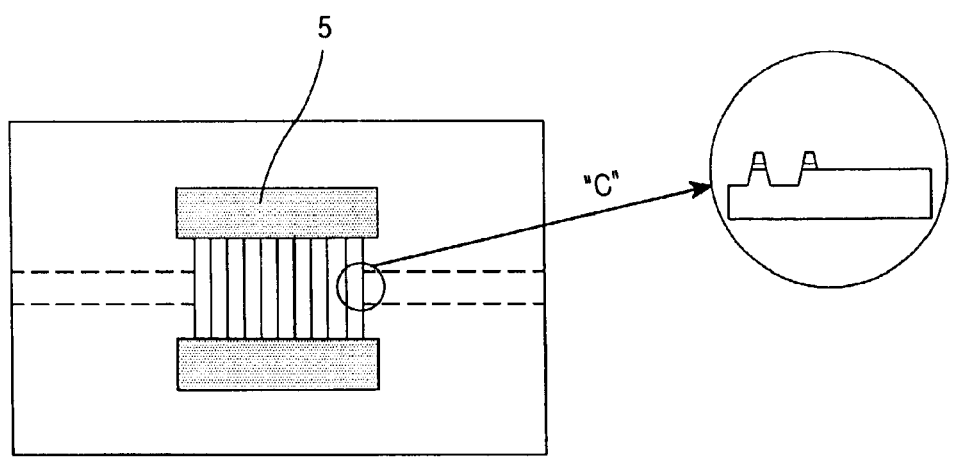
FIG. 3 shows a state in which a stepped portion is formed during an etching for the formation of a diffraction grating; and, FIGS. 4a to 4d are sectional views showing a lift-off etching step according to the present invention.

Finally, as shown in FIG. 2c, parts of the InP cap layer and the InGaAs absorption layer exposed by the removal of the $SiO_2$ film in the preceding step are removed using the photoresist pattern as a mask to complete the manufacturing process of a diffraction grating. Meanwhile, during the process of removing parts of the InP cap layer and the InGaAs absorption layer, etching of the underlying InGaAs absorption layer must be preceded by the removal of the overlying InP cap layer. However, a problem occurs in the selective removal of the overlying InP cap layer when the InP substrate beneath the InGaAs absorption layer is etched simultaneously. Furthermore, any simultaneous and non-selective etching of the InP cap layer and the InGaAs absorption layer makes it difficult to adjust the etching rate, which is in the order of tens of angstroms, and thus may deepen the etching depth. Consequently, there is a possibility that a stepped portion may be formed as shown by the encircled portion C in FIG. 3.

Figure 4A:
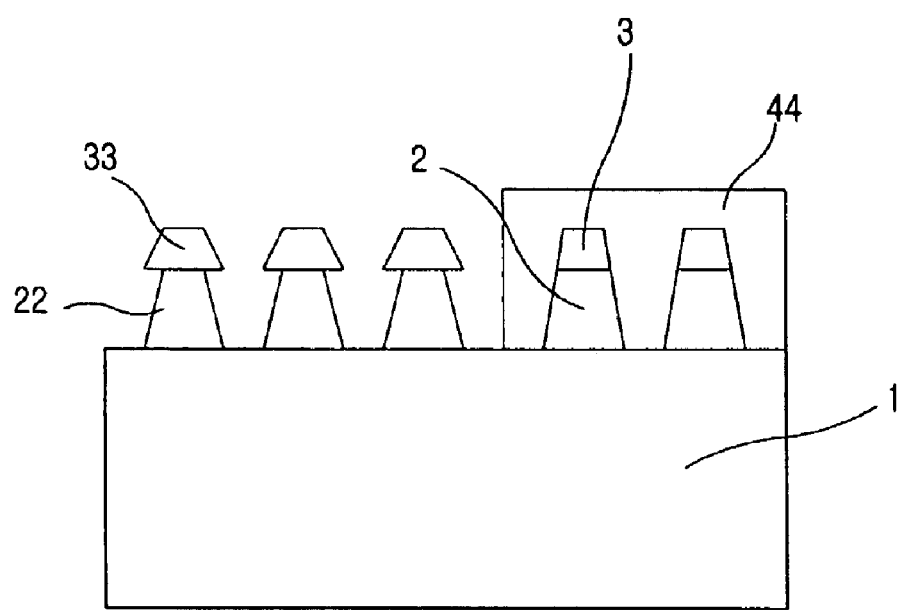
Figure 4B:
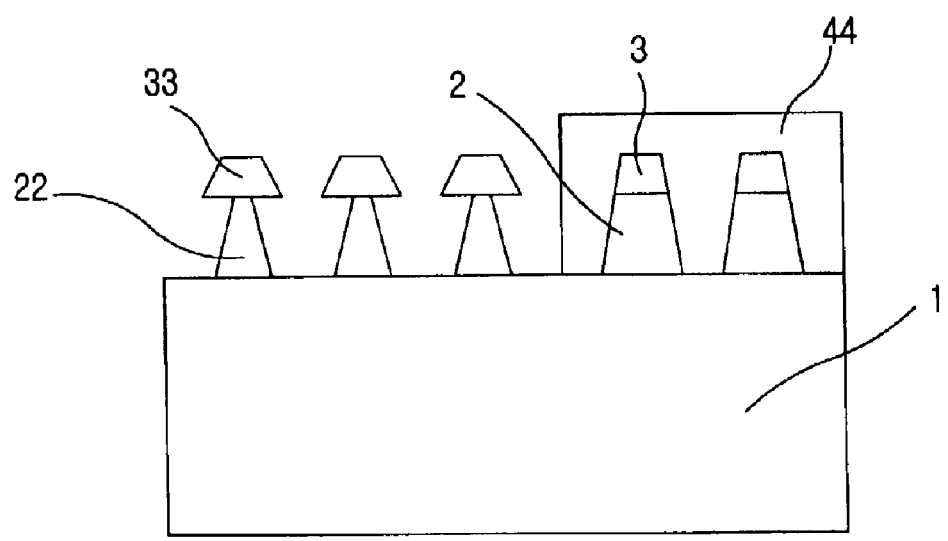
Figure 4C:
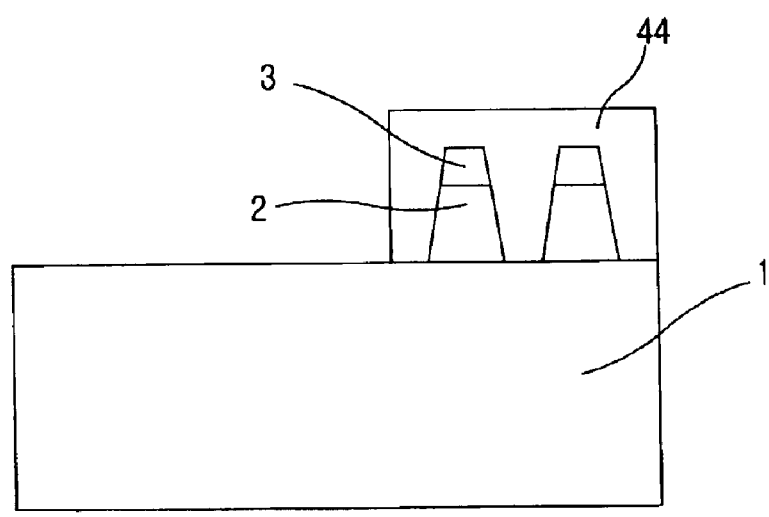

The present invention employs a "lift-off" method as shown in FIGS. 4a to 4d, so as to solve this problem. As shown in FIGS. 4a and 4b, a photoresist mask pattern 44 is formed on the InP cap layer 3, but not on parts of the InP cap layer 33 exposed by the removal of the $SiO_2$ film pattern (the predetermined diffraction grating area, i.e., the area where the InP cap layer and the InGaAs absorption layer must not be removed). Then, the photoresist is used as an etching mask to perform wet-etching using a solution having the composition of $H_3PO_4:H_2O_2:H_2O=1:1:40$. In other words, using the photoresist pattern 44 as a mask, the InGaAs absorption layer is etched selectively for a long time using the above solution. The effect to the InP substrate beneath the InGaAs absorption layer is minimal or has no etching effect. This etches the InGaAs absorption layer only through a side etching, making the InP cap layer capable of being peeled off simultaneously (FIG. 4c).

Figure 4D:
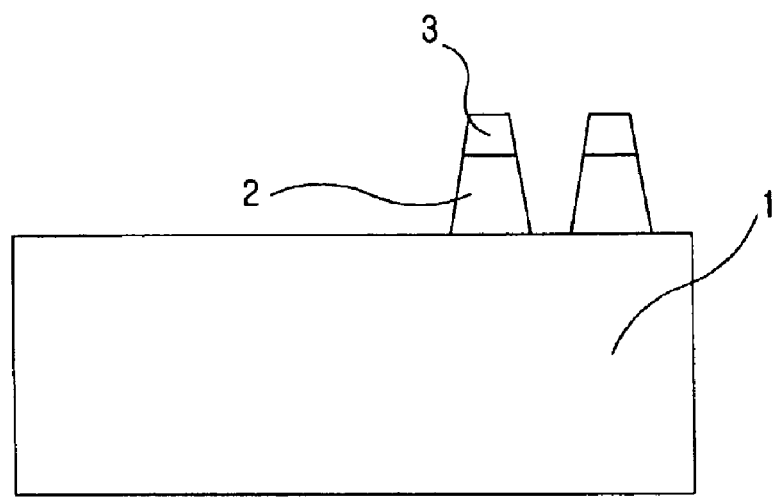

Finally, as shown in FIG. 4d, the photoresist pattern 44 used as a mask is removed to complete the selective manufacturing of a diffraction grating.

As described above, the present invention can prevent a pattern from being irregular due to peeling-off the photoresist and improving its uniformity. Further, uniformity in manufacturing an element is obtained by avoiding any irregular etching along the edge of the pattern and by assuring a stable process.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the present invention should not be limited by the described embodiments but should be defined by the appended claims and the equivalents thereof.

What is claimed is:

1. A method for manufacturing a diffraction grating of a laser diode, the diffraction grating being selectively formed on predetermined parts of a semiconductor substrate, the method comprising the steps of:

forming a first photoresist pattern on an entire upper surface of a semiconductor layer where a diffraction grating is to be formed, the first photoresist pattern is arranged at an interval corresponding to a predetermined grating cycle;

forming a diffraction-grating layer by etching the semiconductor layer under the first photoresist pattern while utilizing the first photoresist pattern as an etching mask;

forming a mask pattern on the diffraction-grating layer except for a predetermined diffraction-grating area;

removing the mask pattern formed on parts of the diffraction-grating layer; and, removing the parts of the diffraction-grating layer left exposed upon removal of the mask pattern.

2. The method according to claim 1, wherein the semiconductor layer is formed by laminating an InGaAs absorption layer and an InP cap layer in sequence on an InP substrate.

3. The method according to claim 1, wherein the mask pattern is a layer selected from the group consisting of $SiO_2$ and SiN.

4. The method according to claim 3, wherein the step of removing parts of the underlying diffraction-grating layer, comprises the steps of:

forming a second photoresist pattern on the InP cap layer except where parts of the InP cap layer are exposed when the mask pattern is removed; and, etching and selectively removing the InGaAs absorption layer from beneath the InP cap layer so that the InP cap layer on the InGaAs absorption layer is peeled off and removed.

5. The method according to claim 4, wherein the step of etching the InGaAs absorption layer is performed through a wet-etching process.

6. The method according to claim 5, wherein the step of performing the wet-etching process is performed using a solution having a composition of $H_3PO_4:H_2O_2:H_2O=1:1:40$.

7. The method according to claim 4, further comprising the step of heat treating for at least two minutes at a temperature of at least 120 Celcius after the step of forming the second photoresist pattern.

* * * * *